United States Patent [19]
Betti et al.

[11] Patent Number: 5,623,220
[45] Date of Patent: Apr. 22, 1997

[54] OFFSET REDUCTION IN A ZERO-DETECT CIRCUIT

[75] Inventors: Giorgio Betti, Milan; Paolo Gadducci, Tirrenia; David Moloney, Cornaredo, all of Italy

[73] Assignee: SGS-Thomson Microelectonics, S.r.l., Agrate Brianza, Italy

[21] Appl. No.: 305,460

[22] Filed: Sep. 13, 1994

[30] Foreign Application Priority Data

Sep. 14, 1993 [EP] European Pat. Off. ............... 93830379

[51] Int. Cl.⁶ ................................................. H03K 5/153
[52] U.S. Cl. .................. 327/79; 327/65; 327/76
[58] Field of Search .......................... 327/79, 74, 307, 327/78, 80, 172, 174, 176, 205, 206, 63, 65, 76; 379/386

[56] References Cited

U.S. PATENT DOCUMENTS

| | | | |
|---|---|---|---|
| Re. 34,428 | 11/1993 | George et al. | 341/118 |
| 3,593,166 | 7/1971 | Martin | 328/150 |
| 3,727,079 | 4/1973 | Garrett | 307/235 |
| 3,755,747 | 8/1973 | Letosky | 327/176 |
| 3,768,024 | 10/1973 | Letosky | 327/79 |
| 3,955,102 | 5/1976 | Chi | 307/235 E |
| 4,079,327 | 3/1978 | Van Uffelen | 328/150 |
| 4,080,574 | 3/1978 | Loosemore et al. | 328/109 |
| 4,090,144 | 5/1978 | Jenik et al. | 328/150 |
| 4,135,161 | 1/1979 | Torrieri | 328/108 |
| 4,137,504 | 1/1979 | Simmons | 328/165 |
| 4,138,649 | 2/1979 | Schaffer | 330/9 |
| 4,272,690 | 6/1981 | Riney et al. | 327/176 |
| 4,297,642 | 10/1981 | Baldwin et al. | 330/9 |
| 4,345,169 | 8/1982 | Saleh | 327/72 |
| 4,352,999 | 10/1982 | Galpin | 307/354 |
| 4,406,988 | 9/1983 | Scholz | 328/150 |
| 4,450,368 | 5/1984 | Spence | 307/362 |
| 4,480,200 | 10/1984 | Tan et al. | 307/354 |
| 4,636,656 | 1/1987 | Snowden et al. | 327/174 |
| 4,697,098 | 9/1987 | Cloke | 307/354 |
| 4,749,879 | 6/1988 | Peterson et al. | 327/79 |
| 4,764,752 | 8/1988 | Ormond | 340/347 NT |
| 4,882,740 | 11/1989 | Abe et al. | 377/49 |
| 5,182,476 | 1/1993 | Hanna et al. | 307/491 |
| 5,278,462 | 1/1994 | Wilson | 307/354 |
| 5,359,652 | 10/1994 | Mulder et al. | 379/386 |

FOREIGN PATENT DOCUMENTS

| | | |
|---|---|---|
| 252609 | 1/1988 | European Pat. Off. |
| 57-113617 | 7/1982 | Japan ................. 327/176 |

OTHER PUBLICATIONS

Electronics Int., Apr. 13, 1978, pp. 135–137, A. Kaniel "Subtractor eliminates op—amp offset, common—mode errors".

*Primary Examiner*—Timothy P. Callahan
*Assistant Examiner*—Kenneth B. Wells
*Attorney, Agent, or Firm*—Robert Groover; Betty Formby; Matthew Anderson

[57] ABSTRACT

A zero-crossing circuit and method, in which the sign of inputs to a comparator is reversed after each zero crossing of the input signal. This means that delay introduced by the comparator does not affect the duty cycle of the output signal, so precision synchronization remains possible.

15 Claims, 4 Drawing Sheets

OFFSET REDUCTION IN A ZERO-DETECT CIRCUIT

BACKGROUND OF THE INVENTION

Zero-crossing detectors are generally composed of a single comparator or of a plurality of cascaded comparators, the output of which changes state every time the input signal crosses the zero level. These circuits are widely employed in digital and in analog-digital systems. The figure-of-merit parameters of these circuits are typically: speed, gain, and the equivalent input offset.

Commonly, in communication systems that employ a peak detection technique, the first derivative of an input signal is fed to a zero-crossing detector. In this way, a digital signal may be obtained that is exactly synchronized with the zero-crossings of the signal representing the first derivative of the input signal and therefore with the positive and negative peaks of the input signal.

In this as in other applications, a net offset of the zero-crossing detector circuit produces an error of synchronization that is commonly referred to as "Pulse Pairing". This phenomenon is graphically depicted in FIG. 1. As may be observed from FIG. 1, for a sinusoidal input signal of frequency f and amplitude Vp, an equivalent input offset $\Delta V$ produces a "Pulse Pairing" delay whose value $\tau$ is given by the following expression:

$$\tau = \left[\frac{1}{\pi f}\right] \sin^{-1}\left(\frac{\Delta V}{Vp}\right).$$

It is evident that error, in terms of the "duty cycle" of the output signal, is introduced by the Pulse Pairing phenomenon. In the depicted example, the "duty cycle" of the output signal contains an error that is equivalent to $2\tau$.

As mentioned above, a zero-crossing detector circuit may be constituted by a single comparator, for example the one depicted in FIG. 3. More often though, because of amplification requirements, the circuit is composed of a plurality of comparators connected in cascade. For example the circuit may be constituted by two comparators G1 and G2 in cascade, as schematically shown in FIG. 2. Of course, the two comparator stages G1 and G2 may have an identical circuit, as the one shown in FIG. 3.

For a comparator circuit as shown in FIG. 3, the standard deviation of the equivalent input offset is given by:

$$\sigma_{offset} = \sqrt{V_{tr1,2}^2 + V_{tr3,4}^2 + \left[\left(\frac{\Delta R}{3R}\right) \cdot V_t\right]^2}$$

where:

$V_{trj,k}$ is the standard deviation of the offset relative to the differential pairs T1-T2 and T3-T4;

$\Delta R/3R$ is the standard deviation of the percentage error relative to the load resistances R;

$V_t$ is the so-called thermal voltage that is equal to about 26 mV at room temperature.

By assuming the two stages G1 and G2 of the circuit of FIG. 2 are identical, they will have the same small signal gain Gj given by:

$$Gj = g_m R = \frac{IR}{2V_t}$$

The equivalent input offset of the circuit will be given by the following expression:

$$\sigma_{offset/input} = \sqrt{(\sigma_{offset1})^2 + \left(\frac{\sigma_{offset2}}{G_1}\right)^2}$$

Notably, the offset of a differential pair of transistors depends primarily on the emitter area of the transistors and the biasing current. For example, in the case of an advanced CMOS process for high frequency, the dependence of the offset on the emitter area may be quantitatively derived from the curves of FIG. 4, which show the value of the standard deviation of the offset ($\mu V$) as a function of the current density ($\mu A/\mu m^2$) and respectively for a minimum emitter area (25 $\mu m^2$), for an emitter area equal to ten times (10×) the minimum area (250 $\mu m^2$) and for an emitter area equivalent to one hundred times (100×) the minimum emitter area (2500 $\mu m^2$). The same curves are shown in semi-logarithmic form in FIG. 5, wherein the reference level 0 dB represents the offset of a minimum emitter area (25 $\mu m^2$) at low current density (which for the case shown is equivalent to 212 $\mu V$).

On the basis of the above sample data, by supposing:

$Area_{tr}$=25 $\mu m^2$ $I_1$=100 $\mu A$ $I_2$=50 $\mu A$

R=4080 $\Omega$ $\Delta R/R$=±0.5%

$V_{tr1,2}=V_{tr3,4}$=424 $\mu V$ a standard deviation of the equivalent input offset may be calculated to be equal to:

$\sigma_{offset}$=601 $\mu V$ giving a $V_{off}$=3 $\sigma_{offset}$=1,8 mV

By employing the above formula for calculating the Pulse Pairing with Vp=100 mV, f=9 MHz, one obtains:

Pulse Pairing=637 psec.

In many applications, for example in read/write channels of a mass memory system, such as a hard disk system, the working frequency of the circuit is often lower than 9 MHz, for example 4 MHz, and the input signal may have a remarkable amplitude, for example on the order of 500 mVp. In a relatively relaxed situation such as this, a circuit such as the one analyzed above would produce a Pulse Pairing of about 286 psec. which could be acceptable, depending on the application. By contrast, in case of high performance applications and of read/write channel specifications for advanced systems, more restrictive conditions may be imposed on Pulse Pairing besides those mentioned above. For example, the requirements of read/write channel specifications of new-generation systems may indicate operating conditions of Vp=100 mV, $f_{min}$=9 MHz and a maximum Pulse Pairing limit of 250 psec.

These requirements would impose a maximum equivalent input offset value of 700 $\mu V$.

By assuming again:

$I_1$=100 $\mu A$ $I_2$=50 $\mu A$

R=4080 $\Omega$ $\Delta R/R$=±0.5% and a 1% precision of the current mirrors that feed the two emitter followers of the comparator circuit of FIG. 3, and by neglecting the contribution of a second comparator stage, the standard deviation of the offset of the differential pairs, suitable to satisfy the above mentioned specs, becomes:

$$V_{tr1,2}=V_{tr3,4}=150 \ \mu V$$

As a consequence, the emitter area required for ensuring such an input offset limit at a bias current of 50 µA is given by:

$$Area_{tr}=100 \ \mu m^2$$

By assuming that the zero-crossing detector circuit is integrated in a mixed technology device, characterized by the formation of bipolar and CMOS structures in the same semiconducting substrate, for which the improvement of application techniques has permitted the decrease of the minimum definition sizes from 2 µm for CMOS gates and 25 µm² for NPN emitters to 0.7 µm and 1 µm², respectively, an emitter area one hundred times greater than the minimum area would have to be realized.

Therefore, while in a mature fabrication process the required increment of the emitter area would correspond to about four times the minimum emitter area, in an advanced fabrication process, the realization of the eight NPNs (four for each comparator stage of FIG. 3) so as to ensure the level of offset established by the specs would be equivalent to eight hundred minimum emitter areas.

It is evident that such a method of containing the offset within the limits dictated by the system specs, in the case of integrated circuits made with advanced fabrication processes would be very burdensome in terms of area requirements.

Alternative ways for reducing the offset have been proposed, for example by realizing parallel differential pairs, one of which would be variable so as to be periodically trimmable through a specific routine for controlling the offset. However, these systems are themselves complex and expensive to implement.

SUMMARY OF THE INVENTION

Therefore, it is a main objective of the present invention to provide an effective method and a simple circuit implementation for eliminating or reducing the equivalent input offset of a comparator stage of a zero-crossing detector circuit for systems that utilize the zero-crossings of an input signal for creating time base references.

Basically, the method of the invention consists in cyclically inverting the connection of the two input terminals of the comparator to which the input signal is fed, after any detected zero-crossing event while preventing this inversion of the input signal from causing a transition of the output. This is ensured by storing the comparator output state assumed by the comparator upon the detection of a zero-crossing event, for a defining period of time, which is a fraction of the minimum interval between any two successive zero-crossings of the input signal. For this purpose, a bistable circuit, suitably made sensitive to edges of a single type of a sampling (timing) signal, which may be the output signal of the comparator or a replica thereof, may be satisfactorily employed.

Of course, the method of the invention may be implemented in any system wherein such a minimum interval between two successive zero-crossings of the input signal is sufficiently long to be correctly "followed" by the circuit of the invention, within the speed limits thereof, as determined by the particular fabrication technology of the integrated circuit.

According to advanced fabrication technologies as they are presently used in the industry, the circuit of the invention may be perfectly capable of correctly following input signals having a frequency on the order of MHz, for example up to 70–90 MHz.

In practice, the effectiveness of the method of the invention is based on the artifice of detecting crossings of the zero level always in one direction. In this way, it is possible to substantially "eliminate" the offset. The only side effect that, on the other hand, can be practically neglected, is that of causing a "translation" on the time base of the output signal (i.e., a delay of propagation) by a quantity that is equivalent to the Pulse Pairing value ($\tau_2$). This "delaying" effect does not prejudice in any way the functionality of the circuit in providing time base references that are perfectly synchronized with the zero-crossings of the input signal.

Of course, where the zero-crossing detector comprises a plurality of comparator stages, besides inverting the inputs of the first (input) comparator stage, it will be necessary to invert simultaneously the differential outputs of a stage at any point of the multistage amplification chain in order to preserve coherence of the output signal with the input signal.

According to an embodiment of the invention, in order to avoid that the switching might disturb the state of the detector circuit, the switching (or the simultaneous switchings in the case of a multistage circuit) may be performed in two steps. Upon the crossing of the zero by the input signal (transition of the comparator), a dedicated circuit may generate a pulse having a preset duration ($\tau_1$), which by enabling a register, will ensure the storing of the output state of the zero-crossing detector circuit in order to make it invariant to a subsequently commanded input inversion.

After a certain delay ($\tau_2$) which may reasonably be set in the order of about $\tau_1/2$, the switching of the input connections (and eventually also of the outputs of one of the comparators of a multistage circuit), may take place.

The only residual contribution to the Pulse Pairing phenomenon would come from the equivalent input offset of an eventual comparator stage that follows in the chain an eventual switch of the outputs of a comparator stage preceding it in a multistage chain. However, such an offset is effectively divided by the gain of the preceding comparator stage(s) and therefore has a substantially negligible value. Conversely, as already said above, the offset of the input comparator stage will be "transformed" in a pure delay of propagation.

BRIEF DESCRIPTION OF THE DRAWINGS

The different aspects and advantages of the circuit of the invention will be more evident through the following description of several important embodiments and by referring to the attached drawings, wherein.

DESCRIPTION OF PREFERRED EMBODIMENTS

Figure 1:
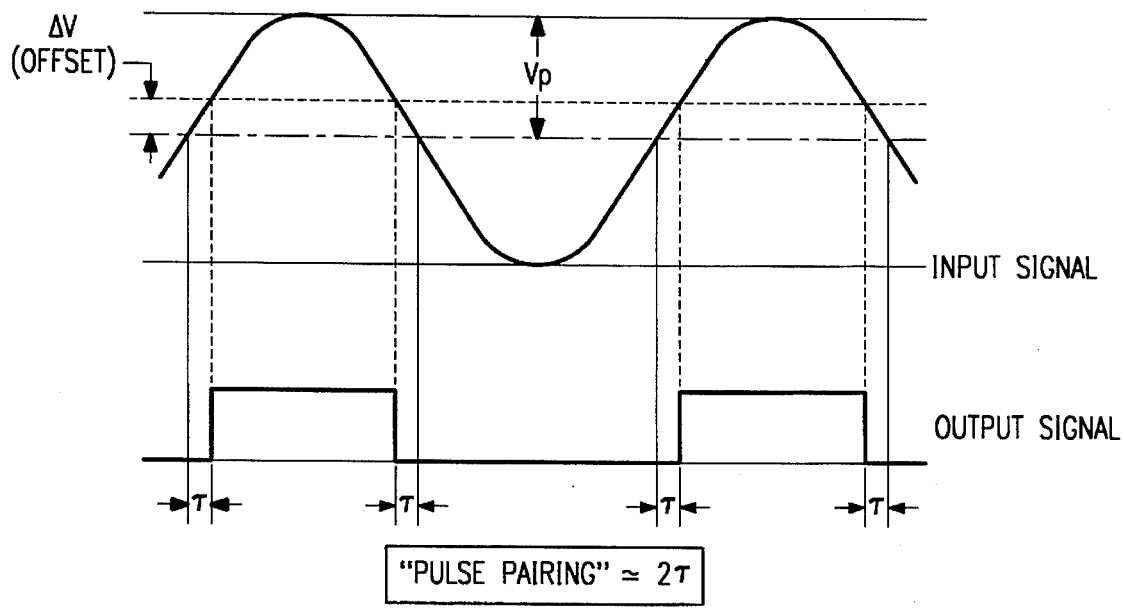
FIG. 1 is a diagrammatical explanation of the Pulse Pairing phenomenon, as described above.
Figure 2:
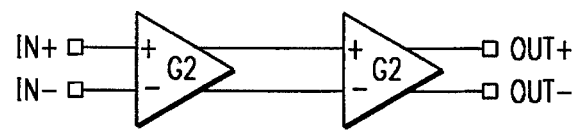
FIG. 2 shows a functional diagram of a zero-crossing detector composed of two comparator stages in cascade, as described above.
Figure 4:
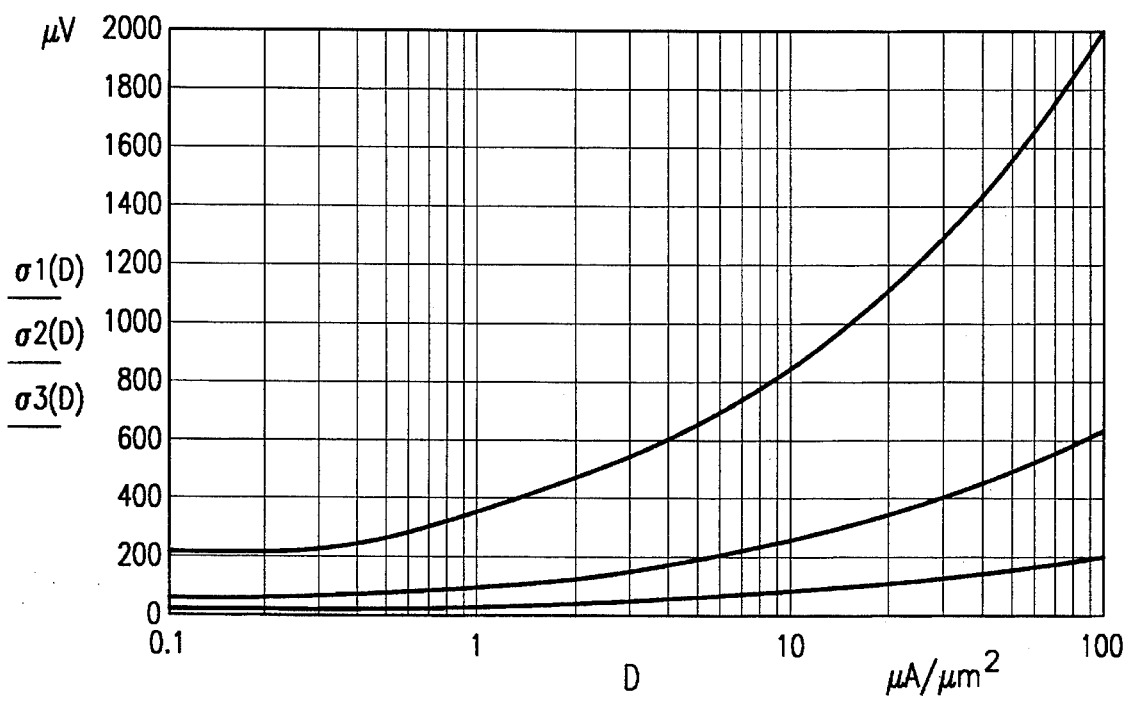
FIGS. 4 and 5 are diagrams that correlate the standard deviation of the offset in function of the size of emitter area, as already described above.
Figure 3:
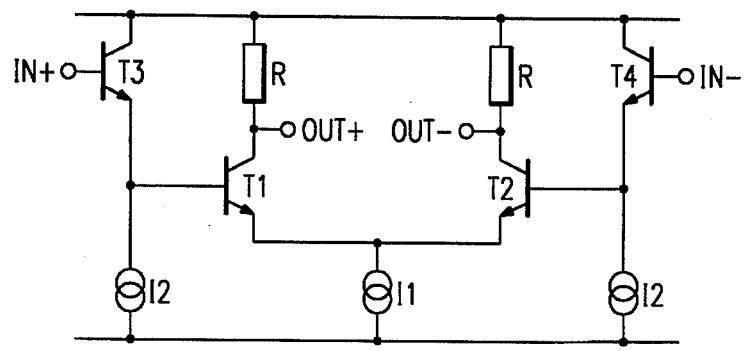
FIG. 3 shows a circuit diagram of a comparator stage usable in a zero-crossing detector, as described above.
Figure 5:
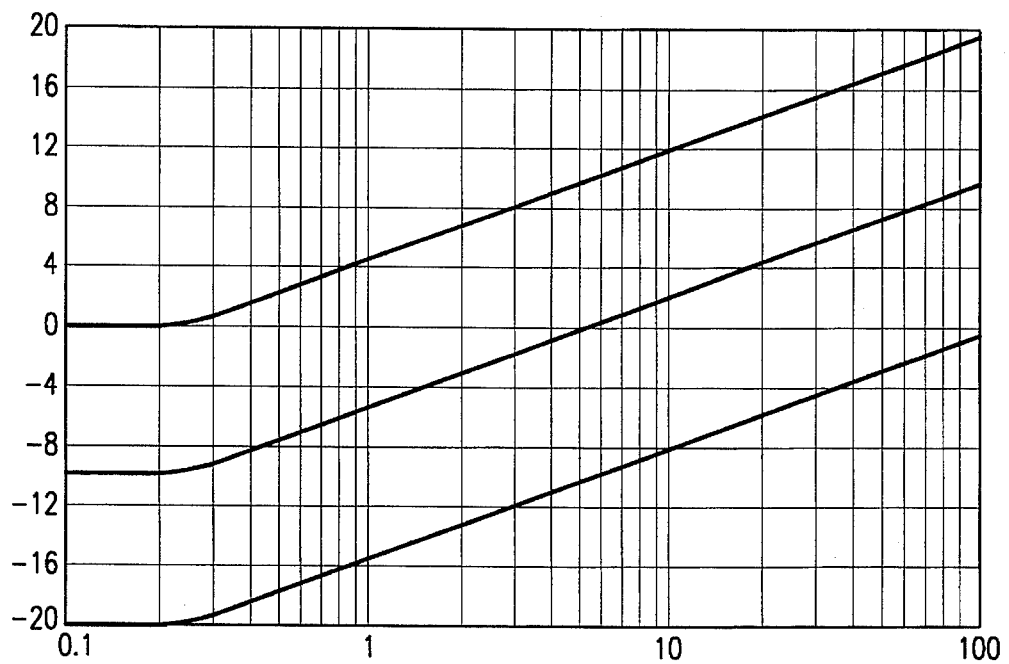
Figure 6:
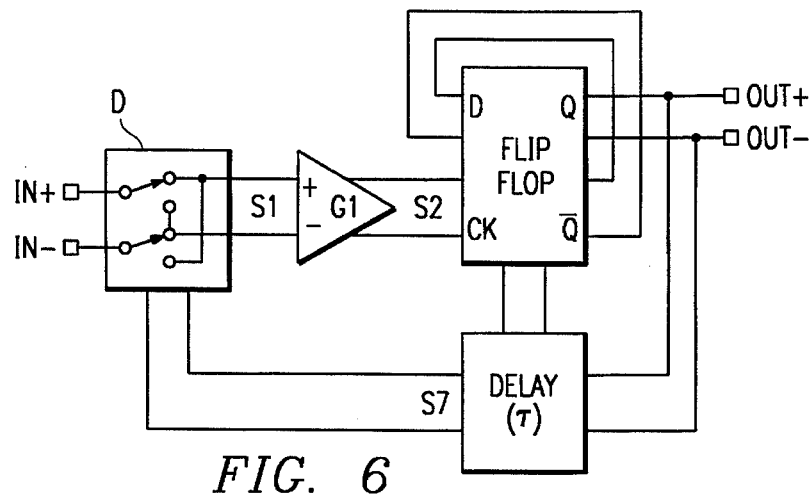
FIG. 6 is a functional diagram of a zero-crossing detector, made according to the present invention, employing a flip-flop and a deviator.

According to a first embodiment of the invention, a functional diagram of which is depicted in FIG. 6, the circuit may be realized by using a deviator D, capable of switching the input connections of a comparator G1, the output signal of which S2 is fed to a clock input terminal (CK) of a flip-flop used for storing the output state. An edge-triggered, D-flip-flop, of the ECL (Emitter Coupled Logic) type may be used. An output (Q) of the flip-flop constitutes the output of the zero-crossing detector circuit of the invention, while the complementary output ($\overline{Q}$) of the flip-flop is fed back to the input (D) thereof.

A so configured flip-flop is sensitive to transitions in only one direction. In the case shown, the flip-flop is sensitive only to low-high transitions of its clock signal S2 (that is to raising fronts of the S2 signal) and insensitive to transitions of opposite sign (that is to falling edges of the S2 signal).

The deviator D is driven by a signal S7, which is a replica of the output signal OUT, delayed by a preset interval of time $\tau$ by a delay circuit.

Figure 8:
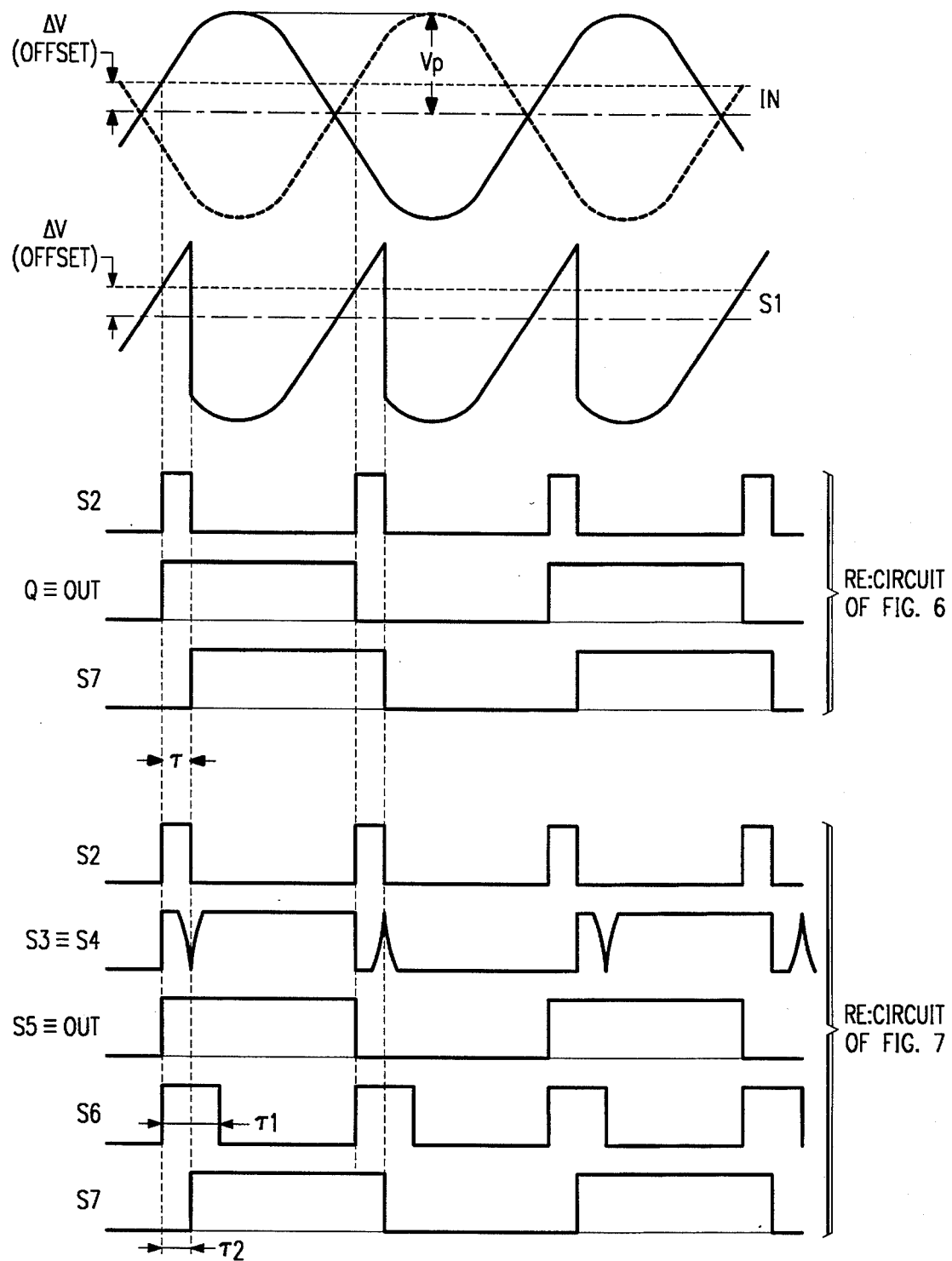
FIG. 8 shows the timing diagrams of zero-crossing detector circuits of the invention as depicted in FIGS. 6 and 7, respectively.

The operation of the circuit, as exemplified by the relative timing diagrams of FIG. 8, is the following.

By way of example, it is supposed that initially the output of the flip-flop is in a low state and that a change of state will take place only in coincidence of a raising front of the clock, that is of the S2 signal.

As soon as the input signal IN (shown in the form of a sinusoidal signal in the example), initially negative, crosses the zero level (less the offset voltage $+\Delta V$), the comparator G1 changes state, thus generating a raising front at the clock input CK of the flip-flop. In coincidence with such a raising front of the S2 signal, the output Q of the flip-flop commutes to a high logic level.

After a preset delay $\tau$, as produced by the delay block in order to permit the comparator G1 and the flip-flop to correctly reach a stable state (in the case described above the stable state being a logic high for both the comparator G1 and the flip-flop), the inputs of the comparator G1 are switched, that is the input signal S1 is virtually made to reverse its sign, thus causing a new change of state of the output signal S2 of the comparator G1 (i.e., a falling front of the signal S2). In view of the fact that the flip-flop is sensitive only to a low-high transition of its clock input and not to the opposite transition, the state of the output Q remains unchanged (stored) until the occurrence of a new zero-crossing event in the input signal S1.

In conclusion, the change of state of the zero-crossing detector is exclusively determined by zero-crossings of the signal present at the input of the comparator G1 characterized by having a positive first derivative (that is by crossings occurring in the same direction).

By assuming the offset introduced by the deviator D is negligible, in view of the fact that the switches that implement the deviator operate with extremely low currents because they practically carry solely the base current of the input transistor pair of the comparator, the only offset contribution to the Pulse Pairing phenomenon is the offset of the differential pair of transistors that drives the clock of the flip-flop, divided by the gain of the comparator G1. Therefore, it is possible, by increasing the gain, to significantly decrease the Pulse Pairing figure of the zero-crossing detector circuit to practically negligible value.

Figure 7:
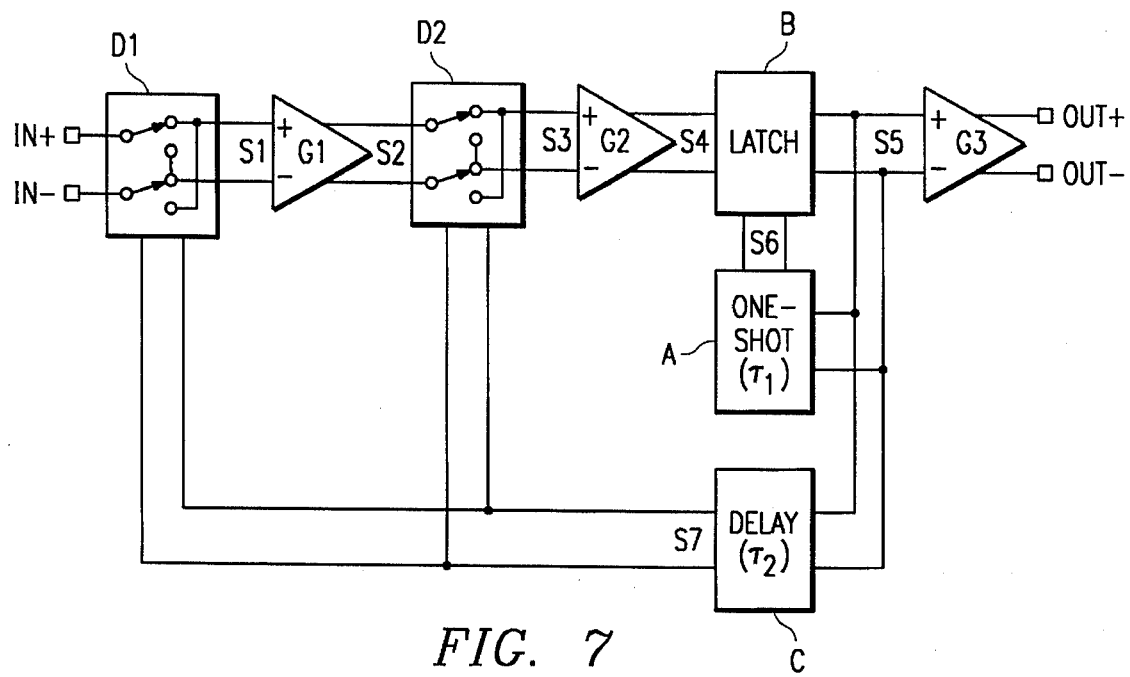
FIG. 7 is a functional diagram of a zero-crossing detector of the invention, employing a latch and two deviators.

According to an alternative embodiment of the invention, depicted in FIG. 7, a zero-crossing detector circuit of the invention may comprise a one-shot pulse generator A which may be driven by the signal S5 or by any other replica of the output signal (OUT), and which produces a pulse of a predefined duration ($\tau_1$).

As clearly shown in the relative diagrams of FIG. 8, at every transition of the output signal S5, the one-shot pulse generator A generates a pulse of predefined duration $\tau_1$, which is employed for enabling a latch circuit, suitable to store the new output state of the circuit, thus preventing any subsequent change of state for the whole duration of the enabling pulse $\tau_1$ (masking period).

The same signal S5 that triggers the one-shot pulse generator A is also fed to a delay circuit C, capable of determining a propagation delay $\tau_2$ of the signal having a defined value that is lower than the masking period $\tau_1$. Normally, a delay $\tau_2 = \frac{1}{2}\tau_1$ will be satisfactory. The delayed signal S7 drives a first deviator D1, which inverts the input connections of the input comparator stage G1 of the circuit, and a second deviator D2, which inverts the outputs of any one of the cascaded stages (G1, G2, . . . ) that may be employed in the zero-crossing detector circuit, thus re-establishing a correct coherence of the signs of the signals.

At every transition of the output signal S5, the new state is kept invariant by the latch B for the duration of a masking interval $\tau_1$. After a delay $\tau_2$ from the switching instant of the output of the circuit, caused by the delay circuit C, the deviators D1 and D2 change state. This causes a virtual inversion of the sign of the input signal S1 of the comparator G1, and a simultaneous inversion produced by the second deviator D2. In view of the fact that S3 is logically identical to S4, these switchings do not cause a transition of the signal present across the output terminals OUT+ and OUT− of the zero-crossing detector circuit, because these events are masked for the entire interval $\tau_1$, during which the latch B is enabled. Therefore, the successive zero-crossing by the input signal S1, will occur virtually in the same direction of the preceding zero-crossing by having virtually inverted the signal through the inversion of the input connections of the comparator G1 during the masking interval $\tau_1$.

Irrespective of the particular circuital implementation that is adopted, as for example the one depicted in FIG. 6 or FIG. 7, the crossing of the zero level virtually always in the same direction causes the offset of the input comparator to transform itself in a pure delay of propagation of the output signal (OUT), which, on the other hand, maintains a perfect synchronization with the succession of zero-crossings of the input signal, notwithstanding the fact that the input differential pair of the comparator G1 may present a non-negligible offset ($\Delta V$).

The timing signals for a certain input signal, in the case of the circuit of FIG. 6 and in the case of the circuit of FIG. 7, respectively, are shown in FIG. 8.

In the case of a circuit as shown in FIG. 6, at every crossing of the zero level (+ΔV of offset in the example considered), the comparator G1 changes state producing an output signal S2. The flip-flop that stores the output state (Q=OUT) is sensitive to transition in only one direction (from a negative to a positive value of the signal S2 in the example considered). After a certain delay τ, the transition of the signal S7 causes the switching of the input connections (signal S1), without producing any change of state of the output signal. The transitions of the output signal coincide with the zero-crossings of the signal S1 present at the input of the comparator G1, always in the same direction.

In the case of a circuit as the one depicted in FIG. 7, at every transition of the output signal (S5=OUT), a pulse S7, having a predetermined duration $\tau_1$, is generated and the pulse S6 enables the storing circuit B, thus preserving the value taken by the output signal (S5=OUT). At an intermediate instant ($\tau_2$) of the interval $\tau_1$, as determined by the delay circuit C, the switching of the inputs of the comparator G1 is commanded by the delayed signal S7. This is equivalent to an inversion of sign of the signal S1 (shown in the form of a sinusoidal signal in the example considered) that is fed to the inputs of the comparator G1. Simultaneously with the inversion of the inputs of the comparator G1, an inversion of the outputs of the same comparator G1 is also effected by the second deviator D2. The form of the signals S1, S2, S3, and S4 (which is substantially equivalent to the signal S3) is shown in FIG. 8. The transitions of the signals S2, S3, and S4, consequent to the inversion of the inputs, as determined by the deviator D1, are masked for the entire duration of the interval $\tau_1$ of the signal S6, which enables the storing circuit B of the output value (S5=OUT).

Naturally, between the stages G1 and G2 may be present any number of amplification stages, connected in cascade.

The deviators (D, D1, and D2), may be implemented in different forms.

Figure 9:
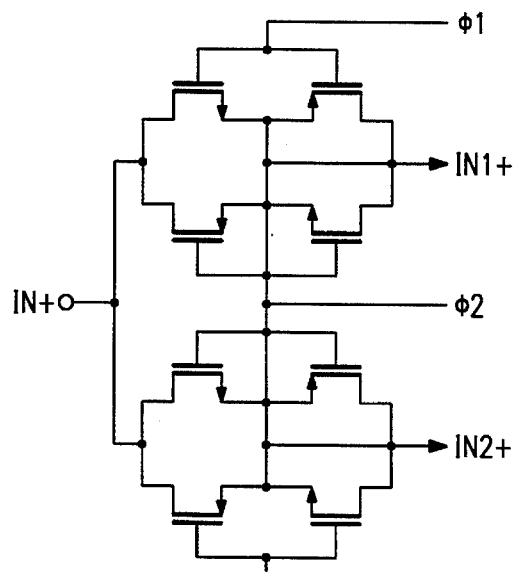
FIG. 9 is a functional diagram of a switching CMOS cell that may be employed in the circuit of the invention.

For example, the deviators may be realized with CMOS structures, as the one shown in FIG. 9. Of course, a deviator (D, D1, or D2) may be realized by employing two switching blocks similar to the one shown in FIG. 9.

Figure 10:
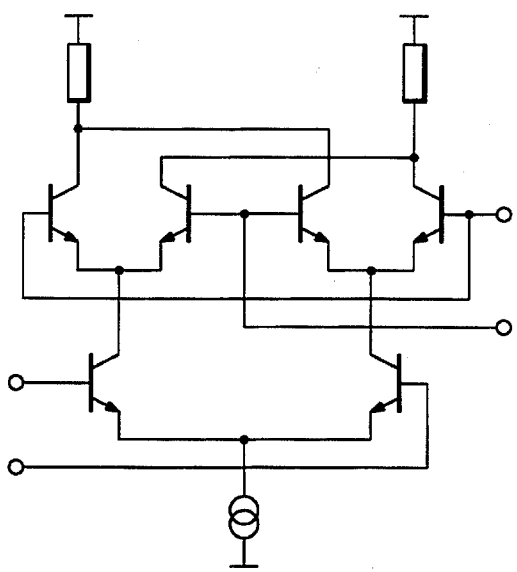
FIG. 10 is a circuit diagram of a deviator-amplifier block made by a so-called Gilbert cell.
Figure 11:
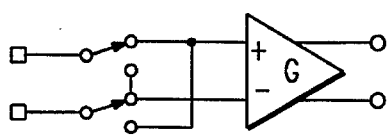
FIG. 11 shows an equivalent diagram of the Gilbert cell of FIG. 10.

Alternatively, a circuit, commonly known as Gilbert cell, as schematically shown in FIG. 10, may be employed for realizing both the deviator as well as a differential gain stage, as depicted in the equivalent circuit diagram of FIG. 11.

We claim:

1. A zero-crossing detector circuit comprising:

a comparator having differential input connections;

a delay circuit, operatively connected to an output of the circuit and connected to propagate an output signal with a defined delay that is a fraction of the minimum interval of time between any two successive zero-crossings of a signal fed to the inputs of said comparator;

a deviator, controlled by said delayed output signal, capable of inverting the inputs of said comparator after a transition of the output signal, so that said comparator receives a differential input signal with either reversed or non-reversed polarity, selectably;

a bistable circuit, sensitive to transitions in one of either a rising or a falling direction of the signal produced by said comparator fed to an input of the bistable circuit, and having an output operatively connected to provide the output of the zero-crossing detector circuit.

2. A circuit according to claim 1, wherein said bistable circuit is an edge-triggered, D-type, flip-flop, a first output of which constitutes the output of the circuit and a second output of which is complementary to said first output and connected to an input of the flip-flop, a clock input of the flip-flop being connected to the output of said comparator.

3. The circuit of claim 1, wherein said deviator consists of a CMOS switch.

4. The circuit of claim 1, wherein said deviator comprises a Gilbert cell.

5. A zero-crossing detector circuit comprising:

a comparator;

a register, which may be enabled, capable of storing the output state of the circuit and providing said state at an output;

a one-shot generator of a single pulse of a predefined duration, having a control terminal operatively connected to the output, and operatively connected to said register to generate an enabling pulse for said register at each transition of the output;

a delaying circuit, operatively coupled to the output of said register, and capable of propagating an output signal with a delay shorter than said predefined duration of said pulse;

at least one deviator, controlled by said delayed output signal, operatively connected to said comparator to invert the inputs of said comparator after each transition of the output.

6. A circuit according to claim 5, comprising a plurality of comparators in cascade, and a second deviator operatively connected to said comparators to invert the outputs of any one comparator of said plurality of comparators simultaneously with said first deviator inverting said inputs of said comparator.

7. A circuit according to claim 6, wherein said second deviator consists of a Gilbert cell.

8. The circuit of claim 5, wherein said deviator consists of a CMOS switch.

9. The circuit of claim 5, wherein said deviator comprises a Gilbert cell.

10. A zero-crossing detector circuit, comprising:

a deviator connected to an input to receive a differential input signal, and to route said input signal, with a connection polarity which is selectably either reversed or non-reversed, to a pair of outputs of said deviator;

a comparator operatively connected to receive said outputs of said deviator, and to provide a comparison output of said comparator derived therefrom;

an edge-triggered digital gate which is connected to receive said comparison output of said comparator, and to provide an output which changes state when said comparison output changes state; said output of said gate being operatively connected to provide a zero-crossing-detected output; and a delay circuit connected to control said connection polarity of said deviator in accordance with the output of said gate, subject to a predetermined delay.

11. The circuit of claim 10, wherein at least one deviator consists of a CMOS switch.

12. The circuit of claim 10, wherein at least one deviator comprises a Gilbert cell.

13. A zero-crossing detector circuit, comprising:

a first deviator connected to receive a differential input signal, and to output said input signal with a connection polarity which is selectably either reversed or non-reversed;

a comparator functionally connected to receive the outputs of said first deviator, and to provide a differential comparison output derived therefrom;

a second deviator connected to receive said comparison output of said comparator, and to output said comparison output with a connection polarity which is selectably either reversed or non-reversed; and a latch which is operatively connected to receive the output of said second deviator, and which is connected to provide an output which changes state when the output of said second deviator changes state, and thereafter cannot again change state for at least a predetermined minimum duration;

wherein said output of said latch is operatively connected, with a predetermined minimum added delay, to control the connection polarity of said deviators.

14. The circuit of claim 11, wherein at least one deviator consists of a CMOS switch.

15. The circuit of claim 11, wherein at least one deviator comprises a Gilbert cell.

* * * * *